United States Patent [19]
Liang et al.

[11] Patent Number: 5,989,953
[45] Date of Patent: Nov. 23, 1999

[54] METHOD FOR MANUFACTURING DRAM CAPACITOR

[75] Inventors: Chia-Wen Liang, Hsinchu Hsien; Jason Jenq, Pingtung, both of Taiwan

[73] Assignee: United Microelectronics Corp., Taiwan

[21] Appl. No.: 08/998,599

[22] Filed: Dec. 29, 1997

[30] Foreign Application Priority Data

Oct. 18, 1997 [TW] Taiwan ................................. 86115353

[51] Int. Cl.$^6$ ............................................. H01L 21/8242
[52] U.S. Cl. ........................ 438/253; 438/239; 438/396
[58] Field of Search ................................. 438/253, 254, 438/396, 397, 296, 255, 398

[56] References Cited

U.S. PATENT DOCUMENTS

5,677,227  10/1997  Yang et al. ............................. 438/253
5,780,339  7/1998  Liu et al. ............................... 438/253

*Primary Examiner*—Michael Trinh
*Attorney, Agent, or Firm*—Rabin & Champagne, P.C.

[57] ABSTRACT

A method for forming a DRAM capacitor that utilizes silicon nitride spacers on two occasions to perform self-aligned contact window etching operations. Furthermore, on the second etching operation, one less photomask is required for the etching of the second via. In addition, a silicon nitride layer over the first polysilicon layer has a smaller thickness than the usual oxide layer in a conventional method of manufacture. Consequently, a shallower contact step height for the capacitor, which is beneficial to the production of miniaturized devices, is obtained. Finally, the tri-fork shaped capacitor structure further increases the surface area of the capacitor so that the capacitance of the DRAM capacitor is increased.

23 Claims, 11 Drawing Sheets

METHOD FOR MANUFACTURING DRAM CAPACITOR

BACKGROUND OF THE INVENTION

1. Field of Invention

The present invention relates to a method for manufacturing dynamic random access memory (DRAM). More particularly, the present invention relates to the manufacturing of a DRAM capacitor that has a larger electrode surface area for increasing the memory storage capacity of a DRAM.

2. Description of Related Art

Figure 1:
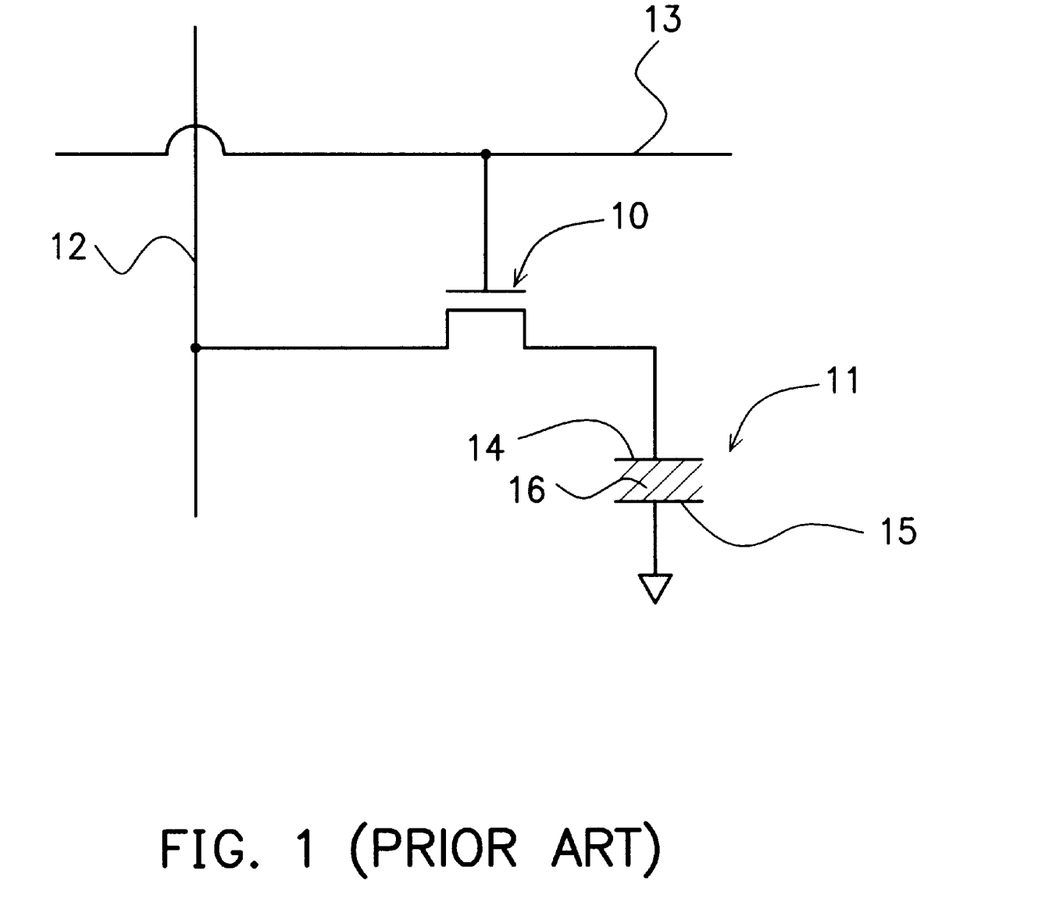
FIG. 1 is a circuit diagram showing a DRAM memory unit.

As microprocessors become more powerful and the amount of software data that need to be processed becomes very large, the amount of memory necessary for storing data becomes great. FIG. 1 is a circuit diagram showing a DRAM memory unit. A DRAM memory unit comprises a pass transistor 10 and a storage capacitor 11. The source terminal of the pass transistor 10 is connected to a bit line 12, the gate terminal is connected to a word line 13, and the drain terminal is connected to the storage electrode, known also as the lower electrode 14, of a storage capacitor 11. The plate electrode 15, also known as an upper electrode or a cell plate, is connected to a fixed voltage source. Between the storage electrode 14 and the plate electrode is a dielectric thin film 16.

A capacitor is at the "heart" of a DRAM storage device. When the amount of electric charges capable of being stored in the capacitor is large, soft errors produced by α-particles can be greatly lowered. Furthermore, a large charge storage capacity in the DRAM capacitor is able to lower its refreshing frequency. In general, the method of increasing the charge storage capacity in a capacitor includes: (1) increasing the dielectric constant of the dielectric layer so that the amount of charges stored in unit area of the capacitor is also increased; (2) reducing the thickness of the dielectric layer, however, there is a minimum thickness for any dielectric material, and under which the quality of the dielectric layer formed will be compromised; (3) increasing the electrode surface area of a capacitor so that more electric charges can be stored in the same capacitor, however, this will cause a lowering of the level of integration for DRAMs.

When a small charge storage capacity is needed in a DRAM capacitor, a conventional two-dimensional or a planar type of capacitor can be fabricated in the integrated circuit. However, a planar type capacitor occupies a rather large surface area on the semiconductor substrate surface, hence is not suitable for high level of integration. Therefore, three-dimensional capacitors, for example, the so-called stacked type or trench type capacitors, are used for increasing the level of integration of DRAMs. Nowadays, even the simple three-dimensional capacitor design is insufficient to provide the necessary capacitance. Consequently, methods of producing DRAM capacitors that can increase the surface area of its electrode within a given substrate area are still being developed.

Figure 2A:
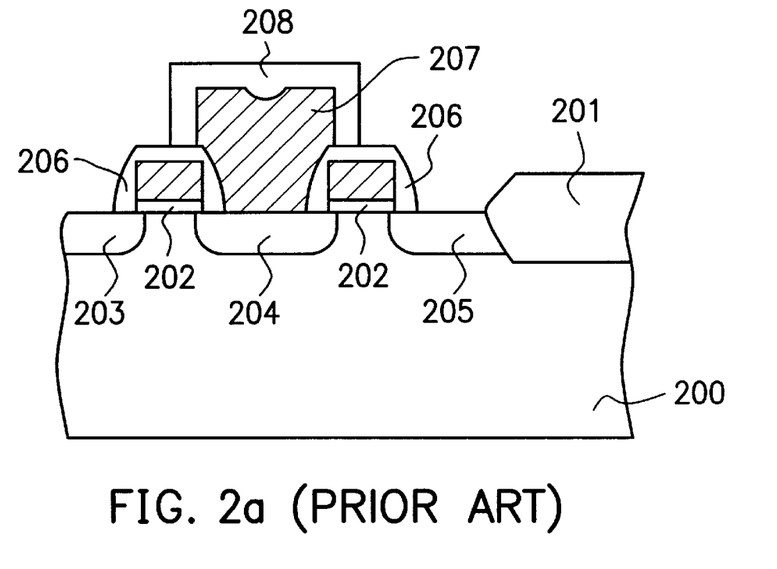
FIGS. 2a through 2d are cross-sectional views showing the progression of manufacturing steps in the fabrication of a trench-type DRAM capacitor according to a conventional method.

FIGS. 2a through 2d are cross-sectional views showing the progression of manufacturing steps in the fabrication of a trench-type DRAM capacitor according to a conventional method. First, as shown in FIG. 2a, a substrate 200 having a field oxide layer 201, gate 202, exposed source/drain regions 203, 204 and 205, and an insulating layer 206 that covers the gate 202 already formed thereon, is provided. Next, a first polysilicon layer is formed over the substrate 200, and then patterned to form bit line 207 that is coupled to the source/drain region 204 using photolithographic and etching processes. Subsequently, a second insulating layer 208 is deposited over the substrate 200. Then, using a mask, the second insulating layer 208 is patterned and etched into a layer that covers only the bit line 207 while exposing the source/drain region 205.

Figure 2B:
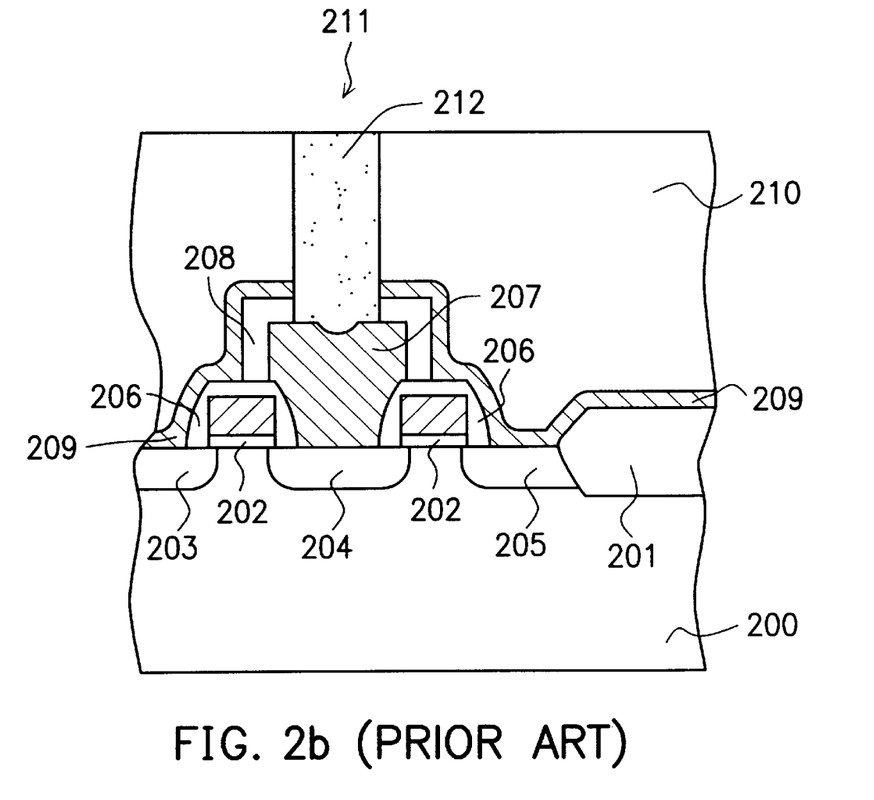

Next, as shown in FIG. 2b, a thin impurities-doped first polysilicon layer 209 is formed over the substrate and the second insulating layer 208, and connected to the source/drain region 205. Later, a photoresist layer 210 is coated over the first polysilicon layer 209, then patterned with a mask and etched to form a via 211. Thereafter, oxide material is deposited into the via 211 forming an oxide layer 212.

Figure 2C:
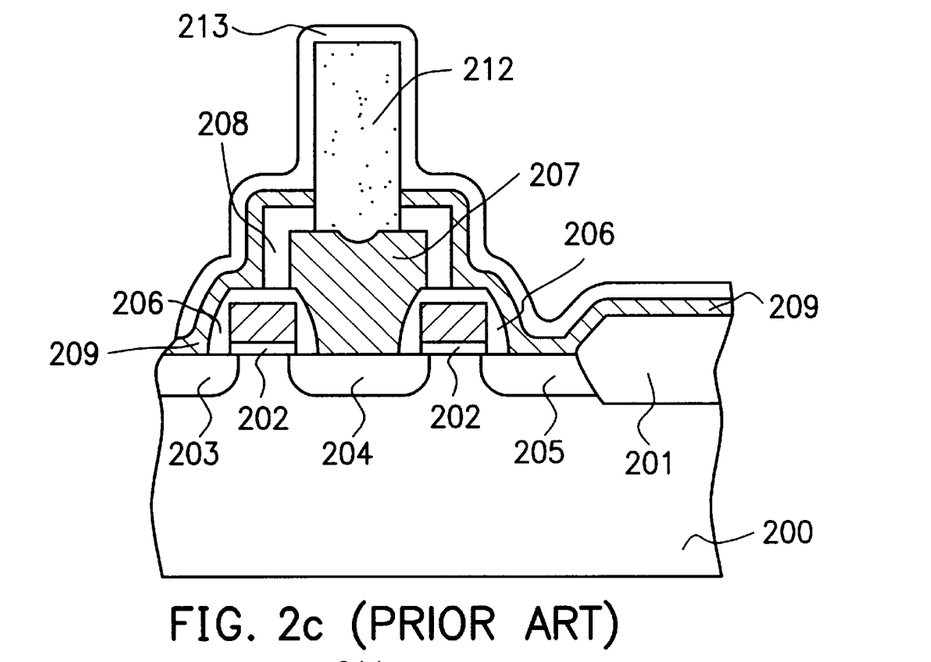

Next, as shown in FIG. 2c, the photoresist layer 210 is removed. Then, a thin impurities-doped second polysilicon layer 213 is formed.

Figure 2D:
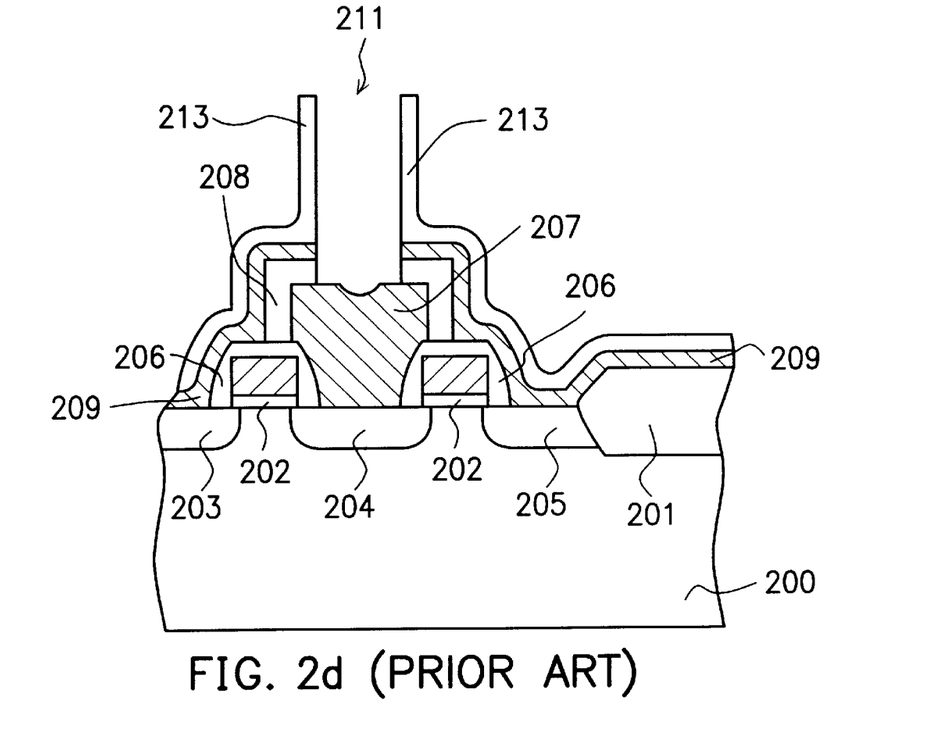

Next, as shown in FIG. 2d, a portion of the second polysilicon layer 213 that locates over the top of the oxide layer 212 is removed exposing the oxide layer 212. Then, the oxide layer 212 between the second polysilicon layer 213 is also removed to form the storage electrode of the capacitor, which is also electrically coupled to the source/drain region 204. Subsequently, a dielectric layer is formed over the surface of the storage electrode, and then an impurities-doped third polysilicon layer is formed over the dielectric layer to form the plate electrode. Finally, after performing the subsequent processing operations such as the formation of a metallic contact and a protective insulating layer, the DRAM capacitor structure is complete.

Figure 3:
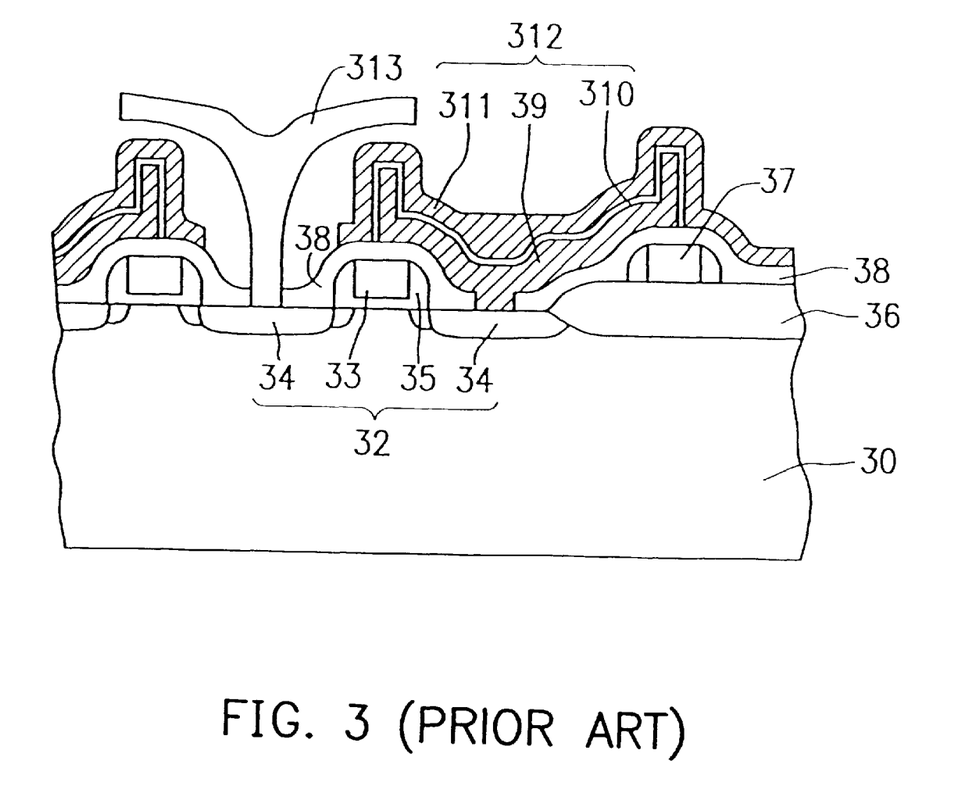
FIG. 3 is a cross-sectional view of a conventional stacked type DRAM capacitor structure.

FIG. 3 is a cross-sectional view of a conventional stacked type DRAM capacitor structure First, a semiconductor substrate 30 having a metallic oxide semiconductor (MOS) transistor 32 already formed thereon is provided. The MOS transistor includes a gate terminal 33, source/drain regions 34 and spacers 35. On top of the substrate 30, there is a field oxide layer 36 and a conductive layer 37. Next, insulating material is deposited over the substrate to form an insulating layer 38, and then the insulating layer 38 is etched to form contact windows at designated locations above the source/drain regions 34. Thereafter, a lower electrode 39, a dielectric layer 310 and an upper electrode 311 are sequentially formed above the contact windows to form a stacked capacitor structure 312. The dielectric layer 310 can be a silicon nitride/silicon dioxide (NO) composite layer or a silicon dioxide/silicon nitride/silicon dioxide (ONO) composite layer. The lower electrode 39 and the upper electrode 311 can be polysilicon layers. Furthermore, the lower electrode 39 can have an undulating and non-planar profile. Finally, subsequent processing operations such as the formation of a metallic contact and protective insulating layer are performed to complete the DRAM capacitor structure.

At present, the conventional method of improving the storage capacity of a DRAM capacitor mainly relies on the manufacture of capacitor having all kinds of rough and uneven electrode surfaces. Although such method is capable of increasing the capacitance of a capacitor a little, it is insufficient to meet the demand for higher capacitance or to provide the capacitance for a miniaturized device. Besides, many complicated and repetitive processing steps are required for their fabrication.

In light of the foregoing, there is a need in the art to provide a better DRAM capacitor structure and method of manufacture.

SUMMARY OF THE INVENTION

Accordingly, the present invention is directed to provide a method for forming a DRAM capacitor suitable for producing a miniaturized semiconductor device, and can effectively increase its capacitance through increasing the surface area of the capacitor.

To achieve these and other advantages and in accordance with the purpose of the invention, as embodied and broadly described herein, the invention provides a method for forming a DRAM capacitor. The method comprises the steps of first forming a transistor above a substrate. The transistor includes gate terminal and source/drain regions. Next, a silicon dioxide layer is formed above the substrate, and then the silicon dioxide is patterned with a mask followed by a first etching operation to form a first via exposing the source/drain region. Thereafter, an impurities-doped first polysilicon layer, a tungsten silicide layer, and a first silicon nitride layer are sequentially formed over the via.

Then, the first polysilicon layer, the tungsten suicide layer and the first silicon nitride layers are patterned with a mask, and a second etching operation is performed to expose a portion of the silicon dioxide layer. In a subsequent step, a second silicon nitride layer is formed over the silicon dioxide layer and the first silicon nitride layer, and then a spacer etching operation is performed to create silicon nitride spacers. Subsequently, a plasma chemical vapor deposition method is used to deposit a third silicon nitride layer over the previously formed layers. Next, an atmospheric pressure chemical vapor deposition method is used to deposit a first oxide layer over the third silicon nitride layer, and then a first borophosphosilicate glass layer is deposited over the first oxide layer. Subsequently, the first borophosphosilicate glass layer is patterned with a mask, and then a third etching operation is performed to etch away a portion of the first borophosphosilicate glass layer, the first oxide layer and the third silicon nitride layer to form a second via.

After that, an impurities-doped second polysilicon layer and a second oxide layer are sequentially formed over the first borophosphosilicate glass layer and the interior of the second via. Next, after the second oxide layer above the second polysilicon layer is removed in an etching back operation, an impurities-doped third polysilicon layer is formed in the interior of the second via and over the second polysilicon layer. Then, a chemical-mechanical polishing method is used to remove the second polysilicon layer and the third polysilicon layer on top of the first borophosphosilicate glass layer. Next, a wet etching operation is performed using a buffered oxide etchant to remove the first borophosphosilicate glass layer, the third polysilicon layer and the first oxide layer to form a tri-fork shaped lower electrode. Finally, a dielectric layer is formed over the lower electrode, and then depositing an upper electrode over the dielectric layer to complete the construction of the capacitor.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification The drawings illustrate embodiments of the invention and, together with the description, serve to explain the principles of the invention. In the drawings.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

FIGS. 4a through 4j are cross-sectional views showing the progression of manufacturing steps in the production of a DRAM capacitor according to one preferred embodiment of this invention.

Figure 4A:
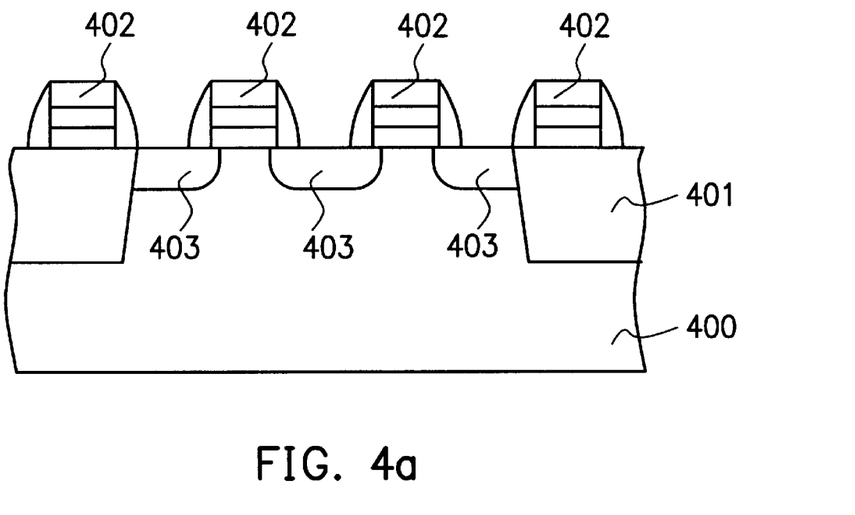
FIGS. 4a through 4j are cross-sectional views showing the progression of manufacturing steps in the production of a DRAM capacitor according to one preferred embodiment of this invention.

First, as shown in FIG. 4a, a semiconductor substrate 400 having field oxide layers or shallow trench isolation structures and a MOS transistor already formed thereon is provided. The MOS transistor comprises gate terminals 402 and source/drain regions 403, and the gate terminals 402 have silicon nitride spacers on its sidewalls.

Figure 4B:
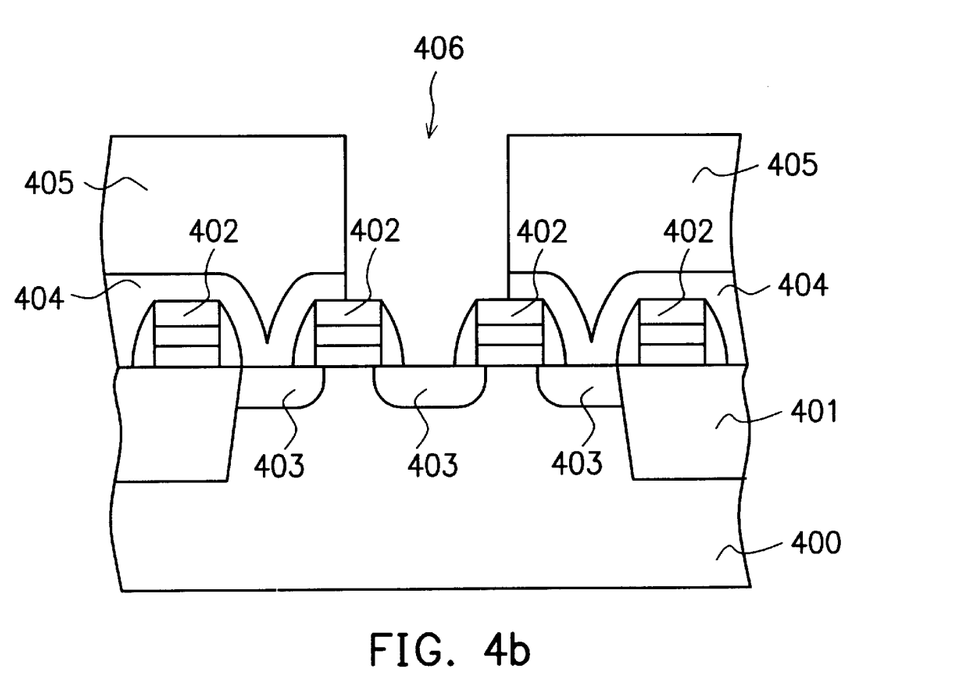

Next, as shown in FIG. 4b, a silicon dioxide layer 404 having a thickness of about 1000 Å to 2000 Å is formed over the gate terminals 402 and the source/drain regions 403. Then, a photoresist layer 405 is formed over the silicon dioxide layer 404 and patterned with a mask. Subsequently, a portion of the silicon dioxide layer 402 is etched in a first etching operation to form a first via 406 exposing a source/drain region 403, and then the photoresist layer 405 is removed. Since the spacers on the sidewalls of the gate terminals 402 can function as a barrier, the etching operation above will form a self-aligned contact window.

Figure 4C:
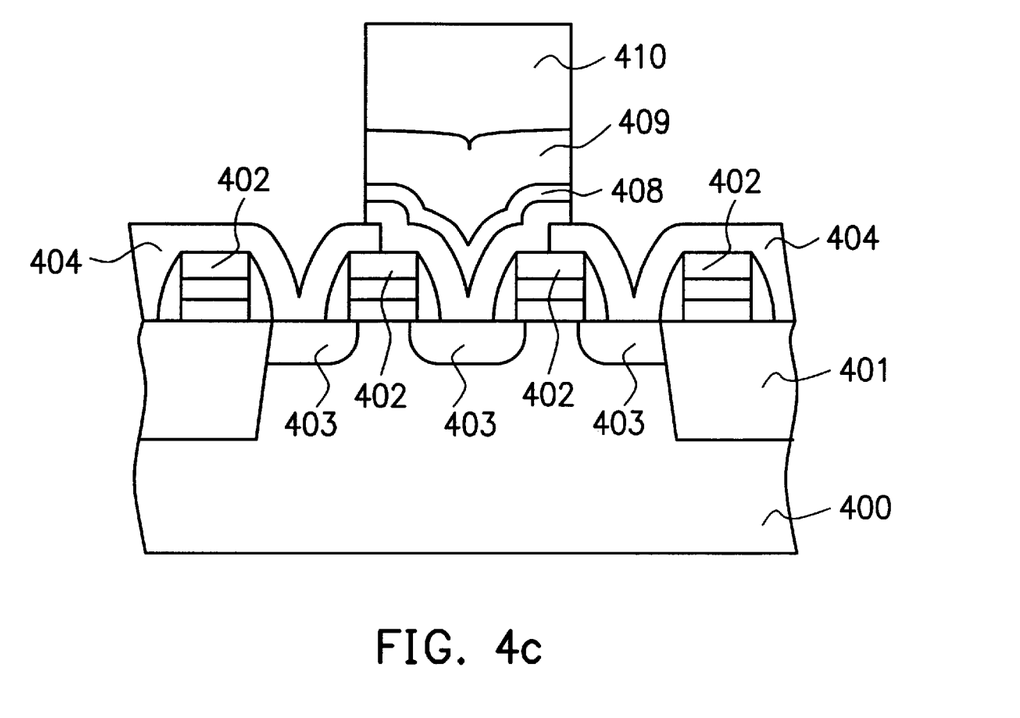

Next, as shown in FIG. 4c, a first polysilicon layer 407, a tungsten suicide layer 408 and a first silicon nitride layer are sequentially formed above the silicon dioxide layer 404 and in the via 406. The first polysilicon layer 407 preferably has a thickness of about 1000 Å, the tungsten suicide layer 408 preferably has a thickness of about 1000 Å, and the first silicon nitride layer preferably has a thickness of about 2000 Å. Thereafter, a second photoresist layer 410 is formed over the first silicon nitride layer 409, and then the second photoresist layer is patterned with a mask. A second etching operation is then carried out to remove a portion of the first polysilicon layer 407, the tungsten silicide layer 408 and the first silicon nitride layer 409 to expose the silicon dioxide layer 404.

Figure 4D:
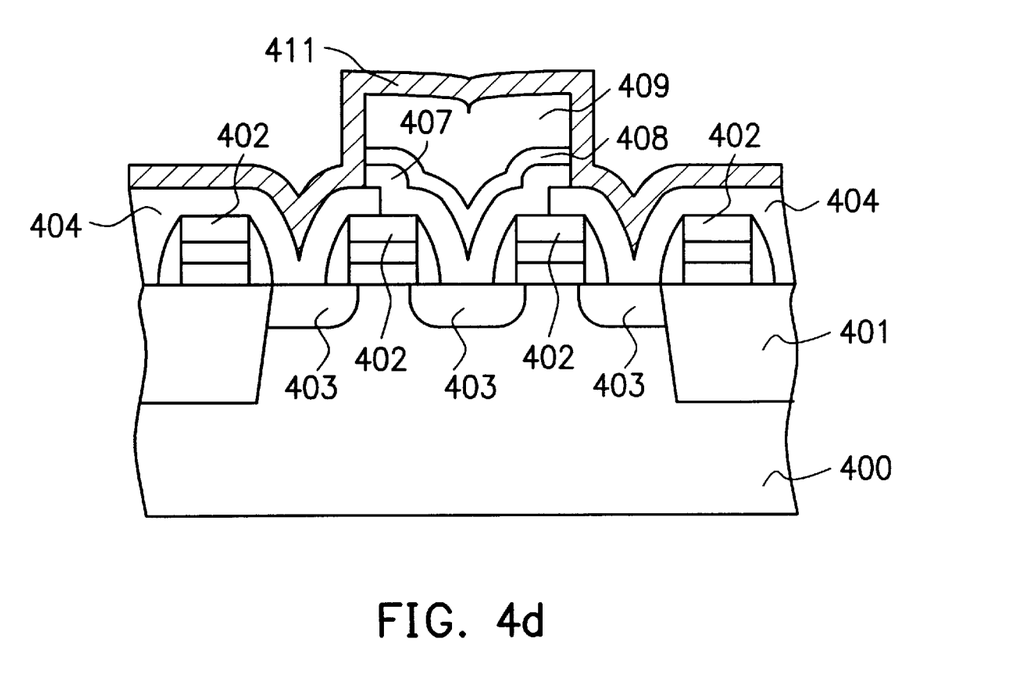

Next, as shown in FIG. 4d, the second photoresist layer 410 is removed. Then, a second silicon nitride layer 411 having a thickness preferably of about 1500 Å is formed over the structure that remains after the removal of the photoresist layer 410.

Figure 4E:
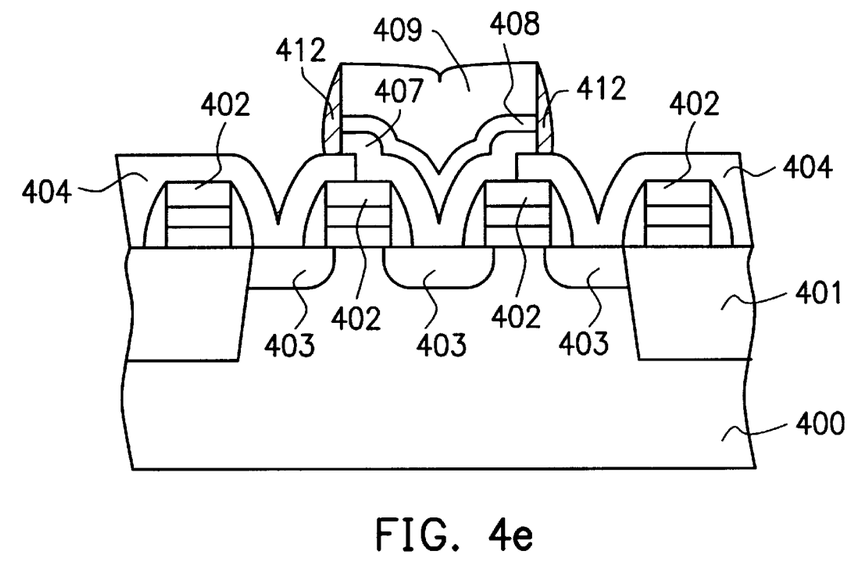

Next, as shown in FIG. 4e, a spacer etching operation is performed to remove a portion of the second silicon nitride layer 411 forming spacer structures 412.

Figure 4F:
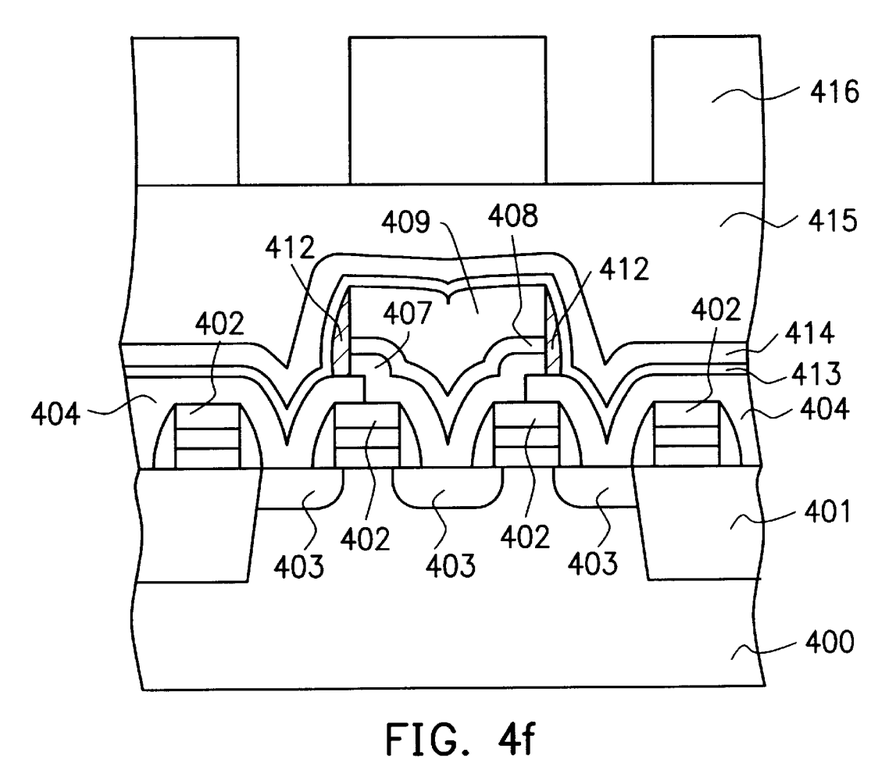

In a subsequent step, as shown in FIG. 4f, a third silicon nitride layer 413, a first oxide layer 414 and a first borophosphosilicate glass layer 415 are sequentially formed over the structure as shown in FIG. 4e. The third silicon nitride layer 413 having a thickness preferably of about 300 Å is formed, for example, by using a plasma chemical vapor deposition method. The first oxide layer 414 having a thickness preferably of about 1500 Å is formed, for example, by using an atmospheric pressure chemical vapor deposition method. The first borophosphosilicate glass layer 415 having a thickness preferably of about 15000 Å is formed, for example, by a heat-flow operation at about 800° C. Thereafter, a third photoresist layer 416 is formed over the first borophosphosilicate glass layer 415, and then the photoresist layer 416 is patterned with a mask.

Figure 4G:
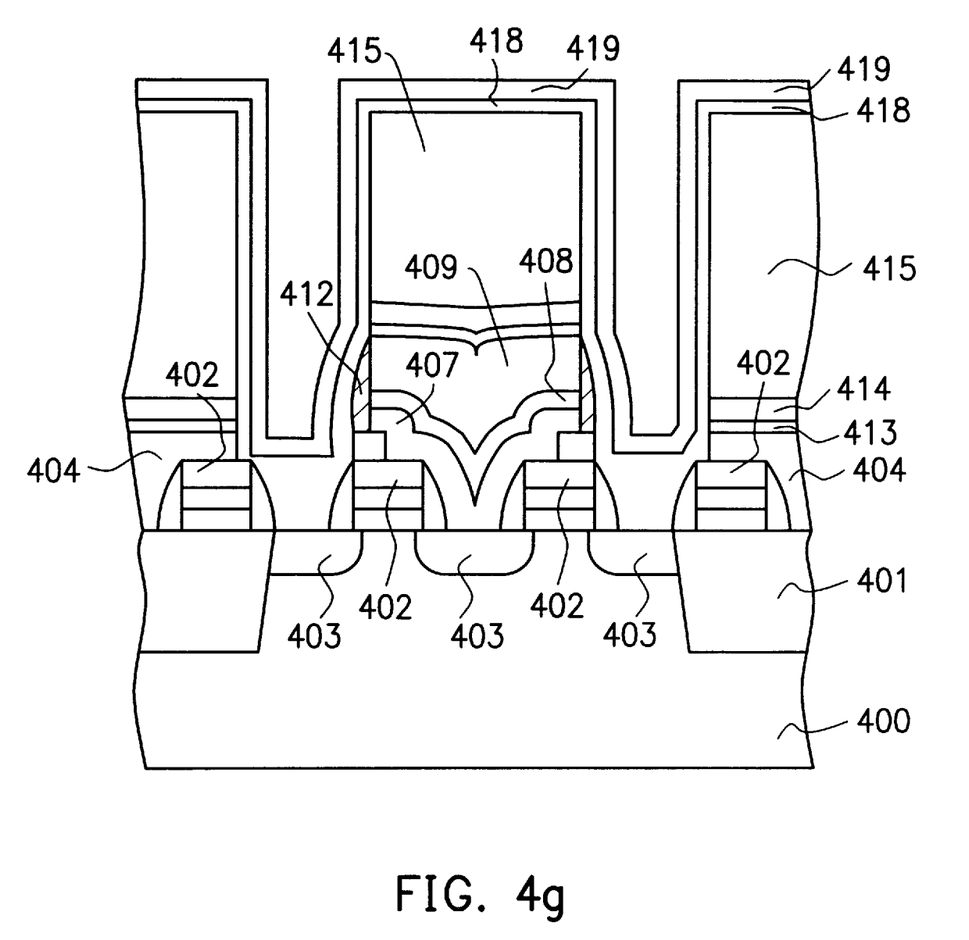

Subsequently, as shown in FIG. 4g, a third etching operation is carried out to form a second via 417 that exposes the source/drain region 403. After removing the third photoresist layer 416, an impurities-doped second polysilicon layer 418 and a second oxide layer 419 are sequentially formed over the first borophosphosilicate glass layer 415 and the interior of the second via 417. The second polysilicon layer 418 preferably has a thickness of about 500 Å, and the second oxide layer 419 a thickness preferably of about 1500 Å. The second oxide layer 419 can be formed, for example, using a plasma chemical vapor deposition method. In the conventional method of forming the desired second via 417, a mask having a smaller opening must first be used to etch a contact window that connects with the source/drain region 403 Then, a second etching operation using a mask having a larger opening has to be employed to complete the formation of a second via 417 However, in this invention, the spacer structures 412 can be utilized as a barrier layer to carry out a self-aligned contact window etching operation in the third etching operation. Hence, the second via can be formed with one less mask patterning step. In other words, one less photomask is needed, thereby simplifying the production.

Figure 4H:
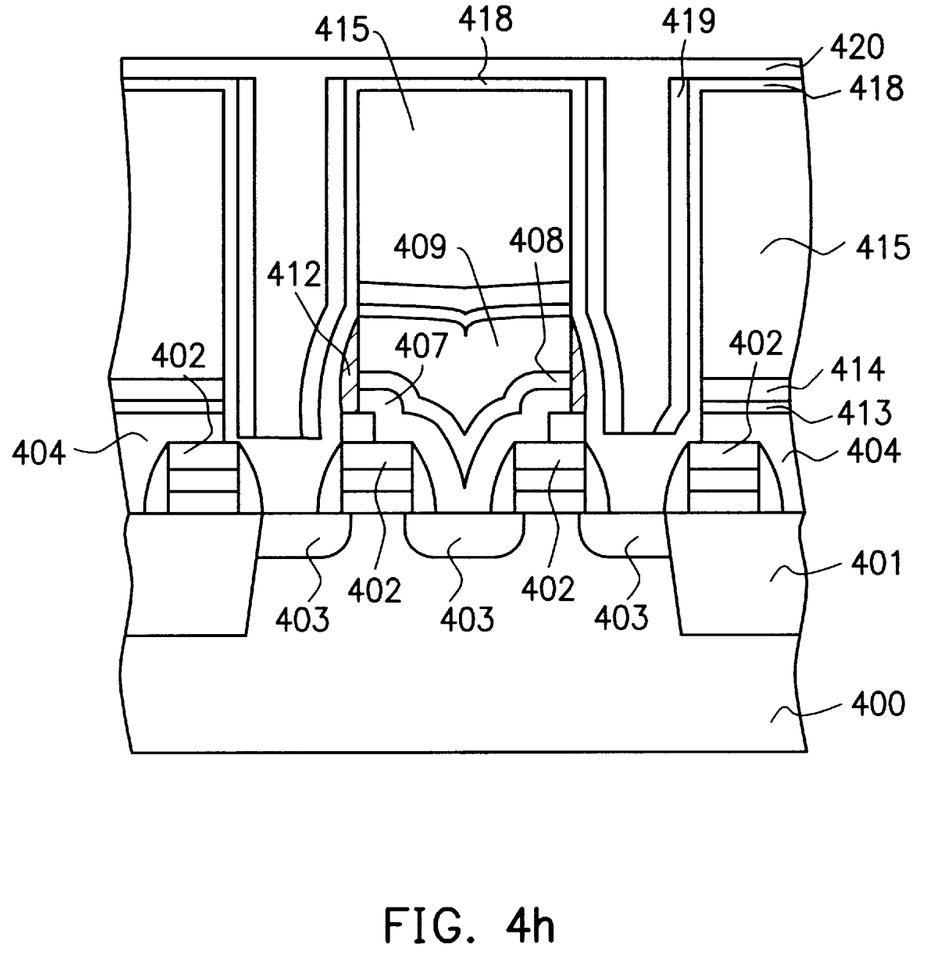

Next, as shown in FIG. 4h, the second oxide layer 419 above the second polysilicon layer 418 is etched back exposing a portion of the second polysilicon layer 418 A portion of the second oxide is left on the sidewalls of the second via 419 forming spacers. Then, an impurities-doped third polysilicon layer 420 having a thickness preferably of about 1000 Å is formed over the second polysilicon layer 418 and in the interior of the second via 417.

Figure 4I:
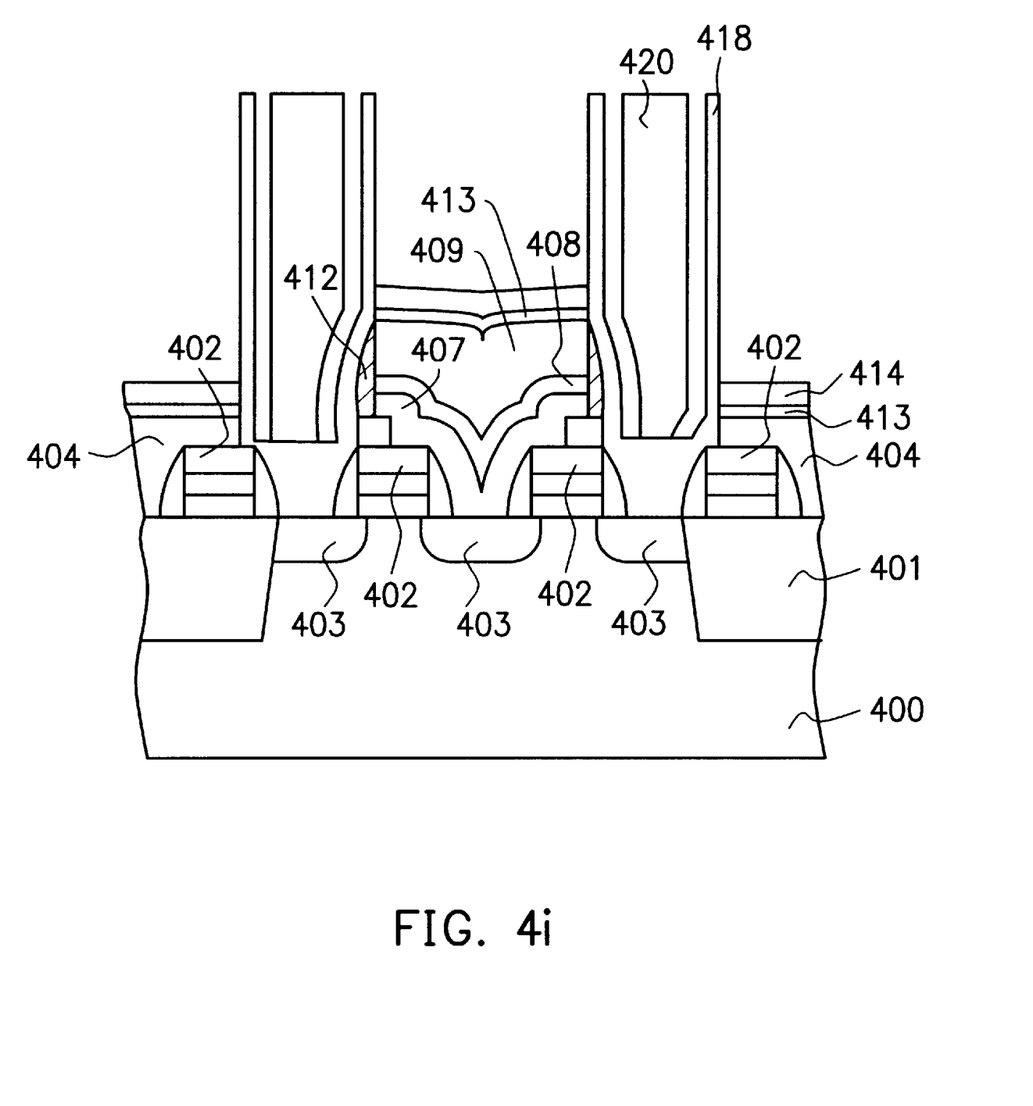

Next, as shown in FIG. 4i, a chemical-mechanical polishing method is used to remove the third polysilicon layer 420 and the second polysilicon layer 418 exposing the first borophosphosilicate glass layer 415. Here, using a chemical-mechanical polishing method instead of a conventional etching back method, the formation of residual impurities clinging to the surface that may affect subsequent processing operations can be prevented. Next, a wet etching operation, for example, using a buffered oxide etchant, is performed to remove the first borophosphosilicate glass layer 415, the first oxide layer 414 and the second oxide layer 419. The etching time is about 400 seconds. The removal of the second oxide layer 419 between the polysilicon layer 418 and the third polysilicon layer 420 forms a tri-fork shaped structure that functions as the lower electrode of the DRAM capacitor.

Figure 4J:
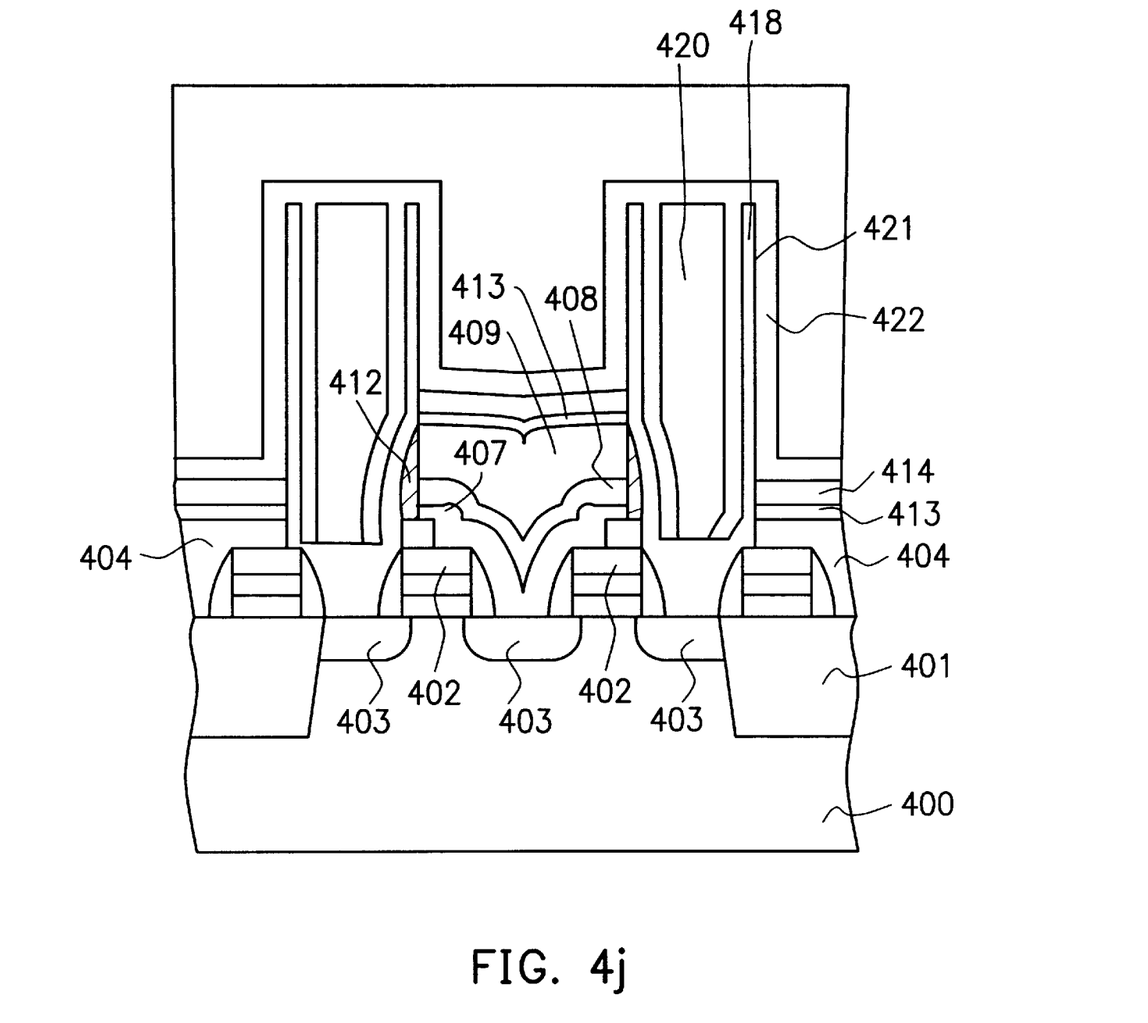

Next, as shown in FIG. 4j, a dielectric thin film 421 is deposited over the lower electrode. For example, the dielectric thin film 421 can be a silicon dioxide/silicon nitride/silicon dioxide (ONO) composite layer having a thickness preferably of about 50 Å to 60 Å. The ONO composite layer can be formed by first heating to form an oxidized layer, then forming a silicon nitride layer on top, finally performing a thermal oxidation operation to form a silicon dioxide layer over the silicon nitride layer. Next, an upper electrode 422 is formed over the dielectric thin film 421. The upper electrode 422, for example, can be an impurities-doped fourth polysilicon layer having a thickness of about 500 Å to 1000 Å formed using a chemical vapor deposition method. The doped ions in the fourth polysilicon serve to increase the electrical conductivity of the layer. After a pattern for the whole capacitor is etched out using a mask, a tri-fork shaped capacitor structure is formed. Finally, the back end process to complete the fabrication of a DRAM capacitor structure are carried out such as planarization by depositing a second borophosphosilicate glass layer 423, and then forming suitable metallic interconnects.

In this invention, a tungsten silicide layer and a silicon nitride layer is formed over the first polysilicon layer, and then using the silicon nitride layer as a barrier layer to protect the first polysilicon layer. In this aspect, it is different from the conventional method of using an atmospheric vapor deposition method with borophosphosilicate glass to form an oxide layer. Furthermore, the thickness of the silicon nitride layer and the tungsten silicide layer used in this invention is smaller than the oxide layer in a conventional method, hence height of the pillar-shaped capacitor is lower than a conventional one. Therefore, in the subsequent fabrication of the contact window, the required depth of etch is smaller than in a conventional process. In other words, the contact window has a shallower contact step height, which is beneficial to the fabrication of a miniaturized device. On the other hand, for the same thickness, the surface area of the tri-fork shaped capacitor structure of this invention is greater than that produced using a conventional method. Consequently, a larger capacitance is obtained.

Therefore, the first characteristic of this invention is the use of silicon nitride spacers on two occasions to perform self-aligned contact window etching operations. Furthermore, when the self-aligned contact window is used to etch the second via, one photomasking step can be eliminated, thus somehow lowering the processing complexity.

Another characteristic of this invention is the use of a chemical-mechanical polishing method instead of a conventional back etching method to remove the second polysilicon layer. Back etching operation will leave behind residual impurities on the etched surface that may affect subsequent processes. On the other hand, the use of a chemical-mechanical polishing operation is able to prevent the formation of impurity residues and increases the yield rate.

A third characteristic of this invention is that the pillar-shaped capacitor structure has a shallower contact step height. Therefore, when the pillar-shaped capacitor having the same height level as that produced by a conventional method is built, the capacitor of this invention has a smaller thickness, which is suitable for fabricating a miniaturized device.

A fourth characteristic of this invention is that the tri-fork shaped capacitor structure increases the surface area of a capacitor considerably, thereby effectively increasing the capacitance.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing a DRAM capacitor comprising the steps of:

providing a semiconductor substrate having at least one transistor and one field oxide layer already formed thereon, wherein the transistor further includes gate and source/drain terminals;

forming a silicon dioxide layer over the gate and the source/drain terminals;

forming a pattern on the silicon dioxide layer with a mask defining a first via location;

removing a portion of the silicon dioxide layer to form the first via;

forming an impurities-doped first polysilicon layer, a tungsten suicide layer and a first silicon nitride layer over the silicon dioxide layer and the first via;

forming a pattern on the first silicon nitride layer, and removing a portion of the first polysilicon layer, the tungsten suicide layer and the first silicon nitride layer to expose a portion of the silicon dioxide layer;

forming a second silicon nitride layer over the first silicon nitride layer and the exposed silicon dioxide layer;

etching the second silicon nitride layer to form a plurality of silicon nitride spacers;

forming a third silicon nitride layer, a first oxide layer and a first borophosphosilicate glass layer over the silicon dioxide layer, the silicon nitride spacers and the first silicon nitride layer;

forming a pattern on the third silicon nitride layer, and defining the locations of a plurality of second vias;

Removing a portion of the silicon dioxide layer, the third silicon nitride layer, the first oxide layer and the first borophosphosilicate glass layer to form the second vias;

forming an impurities-doped second polysilicon layer and a second oxide layer over the first borophosphosilicate glass layer and the interior of the second vias;

etching to remove a portion of the second oxide layer exposing the second polysilicon layer;

forming an impurities-doped third polysilicon layer over the second polysilicon layer and the interior of the second vias;

removing the second polysilicon layer and the third polysilicon layer to expose the first borophosphosilicate glass layer;

removing the first borophosphosilicate glass layer, the first oxide layer and the second oxide layer to form a lower electrode;

forming a thin dielectric film over the lower electrode;

forming a fourth polysilicon layer over the dielectric film to form an upper electrode; and forming a second borophosphosilicate glass layer over the upper electrode.

2. The method of claim 1, wherein the silicon dioxide layer preferably has a thickness of about 1000 Å to 2000 Å.

3. The method of claim 1, wherein the first polysilicon layer preferably has a thickness of about 1000 Å.

4. The method of claim 1, wherein the tungsten silicide layer preferably has a thickness of about 1000 Å.

5. The method of claim 1, wherein the first silicon nitride layer preferably has a thickness of about 2000 Å.

6. The method of claim 1, wherein the second silicon nitride layer preferably has thickness of about 1500 Å.

7. The method of claim 1, wherein the third silicon nitride layer preferably has a thickness of about 300 Å.

8. The method of claim 7, wherein the step of forming the third silicon nitride layer includes using a plasma chemical vapor deposition method.

9. The method of claim 1, wherein the first oxide layer preferably has a thickness of about 1500 Å.

10. The method of claim 9, wherein the step of forming the first oxide layer includes using an atmospheric pressure chemical vapor deposition method.

11. The method of claim 1, wherein the step of removing the second and the third polysilicon layers to expose the first borophosphosilicate glass layer includes using a chemical-mechanical polishing operation.

12. The method of claim 1, wherein the step of removing the first borophosphosilicate glass layer, the first oxide layer and the second oxide layer includes using a buffered oxide etchant in a wet etching operation.

13. The method of claim 12, wherein the step of performing the wet etching operation includes etching for a period of about 400 seconds.

14. The method of claim 1, wherein the step of forming the first borophosphosilicate glass layer includes providing a heat-flow temperature of about 800° C.

15. The method of claim 14, wherein the first borophosphosilicate glass layer preferably has a thickness of about 15000 Å.

16. The method of claim 1, wherein the second polysilicon layer preferably has a thickness of about 500 Å.

17. The method of claim 1, wherein the second oxide layer preferably has a thickness of about 1500 Å.

18. The method of claim 1, wherein the step of forming the second oxide layer includes using a plasma chemical vapor deposition method.

19. The method of claim 1, wherein the third polysilicon layer preferably has a thickness of about 1000 Å.

20. The method of claim 1, wherein the step of forming the dielectric film includes depositing a silicon dioxide/silicon nitride/silicon dioxide composite structure.

21. The method of claim 20, wherein the dielectric film preferably has a thickness of about 50 Å to 60 Å.

22. The method of claim 1, wherein the fourth polysilicon layer preferably has a thickness of about 500 Å to 1000 Å.

23. A method for manufacturing a DRAM capacitor, comprising:

providing a semiconductor substrate having a gate electrode, source/drain regions, and a field oxide layer formed thereon;

forming a silicon dioxide layer over the gate and the source/drain regions;

removing a portion of the silicon dioxide layer to form a first via that exposes a first one of the source/drain regions;

forming a first polysilicon layer over the silicon dioxide layer, and within the first via in contact with the first source/drain region;

forming a tungsten silicide layer over the first polysilicon layer;

forming a first silicon nitride layer over the tungsten silicide layer;

removing a portion of each of the first silicon nitride layer, the tungsten silicide layer, and the first polysilicon layer to expose a portion of the silicon dioxide layer;

forming a plurality of silicon nitride spacers adjacent sidewalls of each of the first polysilicon layer, the tungsten silicide layer, and the first silicon nitride layer and over portions of the silicon dioxide layer;

forming a second silicon nitride layer over the first silicon nitride layer, the silicon nitride spacers, and the silicon dioxide layer;

forming a first oxide layer over the second silicon nitride layer;

forming a borophosphosilicate glass layer over the first oxide layer;

removing a portion of each of the borophosphosilicate glass layer, the first oxide layer, the second silicon nitride layer, and the silicon dioxide layer to form a second via that exposes a second one of the source/drain regions;

forming a second polysilicon layer over the borophosphosilicate glass layer, and within the second via in contact with the second source/drain region;

forming a second oxide layer over the second polysilicon layer;

removing a portion of the second oxide layer above the second polysilicon layer to expose a portion of the second polysilicon layer;

forming a third polysilicon layer over the second polysilicon layer and within the second via;

removing portions of the second polysilicon layer and the third polysilicon layer to expose the borophosphosilicate glass layer;

removing the borophosphosilicate glass layer, the first oxide layer, and the second oxide layer to form a lower electrode comprising remaining portions of each of the first polysilicon layer, the tungsten silicide layer, the first silicon nitride layer, the silicon nitride spacers, the second silicon nitride layer, the second polysilicon layer, and the third polysilicon layer;

forming a thin dielectric film over the lower electrode; and forming a fourth polysilicon layer over the dielectric film to form an upper electrode.

* * * * *